(12) United States Patent
Dong et al.

(10) Patent No.: US 9,825,064 B2
(45) Date of Patent: Nov. 21, 2017

(54) COLOR FILTER SUBSTRATE, ARRAY SUBSTRATE, AND DISPLAY PANEL AND DISPLAY APPARATUS HAVING THE SAME

(71) Applicants: BOE TECHNOLOGY GROUP CO., LTD., Beijing (CN); Chengdu BOE Optoelectronics Technology Co., Ltd., Chengdu (CN)

(72) Inventors: Xiangdan Dong, Beijing (CN); Weiyun Huang, Beijing (CN)

(73) Assignees: BOE TECHNOLOGY GROUP CO., LTD., Chaoyang District, Beijing (CN); Chengdu BOE Optoelectronics Technology Co., Ltd., Hi-tech Development Zone, Chengdu, Sichuan Province (CN)

( * ) Notice: Subject to any disclaimer, the term of this patent is extended or adjusted under 35 U.S.C. 154(b) by 0 days.

(21) Appl. No.: 15/302,912

(22) PCT Filed: Apr. 6, 2016

(86) PCT No.: PCT/CN2016/078557
§ 371 (c)(1),
(2) Date: Oct. 7, 2016

(87) PCT Pub. No.: WO2017/005021
PCT Pub. Date: Jan. 12, 2017

(65) Prior Publication Data
US 2017/0213850 A1    Jul. 27, 2017

(30) Foreign Application Priority Data
Jul. 3, 2015    (CN) .......................... 2015 1 0388905

(51) Int. Cl.
*H01L 27/12* (2006.01)
*G02B 5/20* (2006.01)
(Continued)

(52) U.S. Cl.
CPC ............ *H01L 27/124* (2013.01); *G02B 5/201* (2013.01); *G02F 1/1368* (2013.01);
(Continued)

(58) Field of Classification Search
CPC ........... G02F 1/133514; G02F 1/13473; G02F 2001/136222; H01L 25/075;
(Continued)

(56) References Cited

U.S. PATENT DOCUMENTS

2005/0140906 A1    6/2005  Baek
2006/0290831 A1*  12/2006  You .................. G02F 1/133514
                                                                  349/56

(Continued)

FOREIGN PATENT DOCUMENTS

CN    201654403 U    11/2010
CN    103645584 A     3/2014
(Continued)

OTHER PUBLICATIONS

International Search Report & Written Opinion dated Jul. 5, 2016 regarding PCT/CN2016/078557.
(Continued)

*Primary Examiner* — Sonya D McCall Shepard
(74) *Attorney, Agent, or Firm* — Intellectual Valley Law, P.C.

(57) ABSTRACT

The present application discloses a display panel comprising an array of pixel units, each pixel unit comprising a red sub-pixel, a green sub-pixel, and a blue sub-pixel; the red sub-pixel comprising a red light emitting portion; the green sub-pixel comprising a green light emitting portion; and the blue sub-pixel comprising a blue light emitting portion; at least one of the red sub-pixel, the green sub-pixel, and the blue sub-pixel comprising a white light emitting portion for enhancing brightness of the at least one sub-pixel. A first
(Continued)

white color coordinate and a second white color coordinate are substantially the same. The first white color coordinate is a white color coordinate of combined light of light emitted from the red sub-pixel, the green sub-pixel, and the blue sub-pixel. The second white color coordinate is a white color coordinate of combined light of light emitted from equal area units of the red light emitting portion, the green light emitting portion, and the blue light emitting portion.

20 Claims, 6 Drawing Sheets

(51) Int. Cl.
    *G02F 1/1335*     (2006.01)
    *G02F 1/1343*     (2006.01)
    *G02F 1/1362*     (2006.01)
    *G02F 1/1368*     (2006.01)
    *H01L 27/32*     (2006.01)

(52) U.S. Cl.
    CPC .. *G02F 1/133514* (2013.01); *G02F 1/134309* (2013.01); *G02F 1/136286* (2013.01); *G02F 2001/134345* (2013.01); *G02F 2201/123* (2013.01); *H01L 27/322* (2013.01); *H01L 27/3213* (2013.01); *H01L 27/3262* (2013.01)

(58) Field of Classification Search
    CPC ............. H01L 25/0756; H01L 25/0753; H01L 27/15; H01L 33/50; H01L 51/504; H01L 51/5064; H01L 51/508; H01L 51/5278; H01L 33/00; H01L 31/12; C09K 11/06; F21K 2099/005; H05B 33/12; H05B 33/22; H05B 33/24

See application file for complete search history.

(56) References Cited

U.S. PATENT DOCUMENTS

| | | | |
|---|---|---|---|
| 2008/0218070 A1* | 9/2008 | Kobayashi | H01L 27/3213 313/506 |
| 2011/0084271 A1* | 4/2011 | Yamazaki | B82Y 30/00 257/43 |
| 2011/0298778 A1* | 12/2011 | Chiang | G09G 3/3648 345/212 |
| 2012/0188494 A1* | 7/2012 | Yoshida | G02F 1/133514 349/106 |

FOREIGN PATENT DOCUMENTS

| | | |
|---|---|---|
| CN | 104049430 A | 9/2014 |
| CN | 104297991 A | 1/2015 |

OTHER PUBLICATIONS

The First Office Action in the Chinese Patent Application No. 201510388905.5, dated May 26, 2017; English translation attached.

\* cited by examiner

COLOR FILTER SUBSTRATE, ARRAY SUBSTRATE, AND DISPLAY PANEL AND DISPLAY APPARATUS HAVING THE SAME

CROSS-REFERENCE TO RELATED APPLICATION

This application is a national stage application under 35 U.S.C. §371 of International Application No. PCT/CN2016/078557, filed Apr. 6, 2016, which claims priority to Chinese Patent Application No. 201510388905.5, filed Jul. 3, 2015, the contents of which are incorporated by reference in the entirety.

TECHNICAL FIELD

The present invention relates to display technology, more particularly, to a color filter substrate, an array substrate, and a display panel and a display apparatus having the same.

BACKGROUND

Thin film transistor liquid crystal display (TFT-LCD) devices have dominated the current flat-panel display market due to its advantages of small size, no radiation output, low manufacturing costs, and so on. A thin film transistor liquid crystal display device typically includes a color filter substrate, a thin film transistor array substrate, and a liquid crystal layer filled within the cell made by assembling the color filter substrate and the array substrate together.

The majority of TFT-LCDs is a RGB display device. Typically, the RGB display device includes a pixel unit having three color sub-pixels: a red sub-pixel, a green sub-pixel, and a blue sub-pixel. By adjusting gray values of three color sub-pixels, the color and brightness of the pixel unit can be controlled. The RGB display device includes color filters that filter the color of the backlight. This results in a relatively lower light transmission rate. To improve the brightness of the display device, it is required to have a brighter backlight, leading to a relatively high power consumption.

A RGBW display device is another type of display device that includes a pixel unit having four color sub-pixels: a red sub-pixel, a green sub-pixel, a blue sub-pixel, and a white sub-pixel. The RGBW display device has a relatively higher light transmission rate and relatively lower power consumption as compared to the RGB display device.

SUMMARY

In one aspect, the present disclosure provides a display panel comprising an array of pixel units, each pixel unit comprising a red sub-pixel, a green sub-pixel, and a blue sub-pixel, the red sub-pixel comprising a red light emitting portion; the green sub-pixel comprising a green light emitting portion; and the blue sub-pixel comprising a blue light emitting portion; and at least one of the red sub-pixel, the green sub-pixel, and the blue sub-pixel comprising a white light emitting portion for enhancing brightness of the at least one sub-pixel.

Optionally, a first white color coordinate and a second white color coordinate are substantially the same. The first white color coordinate is a white color coordinate of combined light of light emitted from the red sub-pixel, the green sub-pixel, and the blue sub-pixel. The second white color coordinate is a white color coordinate of combined light of light emitted from equal area units of the red light emitting portion, the green light emitting portion, and the blue light emitting portion.

Optionally, the red light emitting portion is a red color filter, the green light emitting portion is a green color filter, the blue light emitting portion is a blue color filter, and the white light emitting portion is a white color filter.

Optionally, at least one of the red color filter, the green color filter, and the blue color filter is a rectangle with a protrusion at a corner.

Optionally, at least one of the red color filter, the green color filter, and the blue color filter is a rectangle with a cut-out at a corner.

Optionally, each sub-pixel comprises a pixel electrode; the red light emitting portion is a portion of the red color filter overlapping with a pixel electrode in the red sub-pixel in plan view of the display panel; the green light emitting portion is a portion of the green color filter overlapping with a pixel electrode in the green sub-pixel in plan view of the display panel; the blue light emitting portion is a portion of the blue color filter overlapping with a pixel electrode in the blue sub-pixel in plan view of the display panel.

Optionally, the white light emitting portion is a portion of the white color filter overlapping with a corresponding pixel electrode in plan view of the display panel; each sub-pixel comprises a pixel electrode comprising a first portion and a second portion; the first portion corresponds to one of the red light emitting portion, the green light emitting portion, and the blue light emitting portion; and the second portion corresponds to the white light emitting portion.

Optionally, the red light emitting portion comprises a red emitting layer, the green light emitting portion comprises a green emitting layer, the blue light emitting portion comprises a blue emitting layer, the white sub-pixel portion comprises a white emitting layer; the second white color coordinate is a white color coordinate of combined light of light emitted from equal area units of the red emitting layer, the green emitting layer, and the blue emitting layer.

Optionally, each of the red sub-pixel, the green sub-pixel, and the blue sub-pixel comprises a white light emitting portion for enhancing brightness.

Optionally, the display panel further comprises a plurality of single gate lines and a plurality of data lines crossing over each other, defining a plurality of sub-pixels within each pixel unit; the first portion and the second portion are integrally formed; each sub-pixel comprises a single thin film transistor, the gate electrode of the single thin film transistor is electrically connected to a single gate line corresponding to the sub-pixel, the source electrode of the single thin film transistor is electrically connected to the date line corresponding to the sub-pixel, and the drain electrode of the thin film transistor is electrically connected to a pixel electrode.

Optionally, each data line has a shape compatible with the shape of a corresponding pixel electrode.

Optionally, the display panel further comprises a plurality of single gate tines and a plurality of data lines crossing over each other, defining a plurality of sub-pixels within each pixel unit; the first portion is spaced apart from the second portion; each sub-pixel includes two thin film transistors; two gate electrodes of the two thin film transistors within each sub-pixel are electrically connected to two gate lines adjacent to each sub-pixel, respectively; two source electrodes of the two thin film transistors within each sub-pixel are electrically connected to two data lines corresponding to the sub-pixel, respectively; two drain electrodes of the two thin film transistors within each sub-pixel are electrically connected to the first portion and the second portion of a pixel electrode, respectively.

Optionally, the display panel further comprises a plurality of single gate lines and a plurality of data lines crossing over each other, defining a plurality of sub-pixels within each pixel unit; the plurality of gate lines include two single gate lines and a plurality of dual gate lines between the two single gate lines; the first portion is spaced apart from the second portion; each sub-pixel includes two thin film transistors; two gate electrodes of the two thin film transistors within each sub-pixel are electrically connected to two gate lines adjacent to each sub-pixel, respectively; two source electrodes of the two thin film transistors within each sub-pixel are electrically connected to two data lines corresponding to the sub-pixel, respectively; two drain electrodes of the two thin film transistors within each sub-pixel are electrically connected to the first portion and the second portion of the pixel electrode, respectively.

Optionally, each sub-pixel comprises a pixel electrode; the red light emitting portion comprises an overlapping area $A_R$ with the pixel electrode in plan view of the substrate, the white light emitting portion corresponding to the red color filter comprises an overlapping area $B_R$ with the pixel electrode in plan view of the substrate; the green light emitting portion comprises an overlapping area $A_G$ with the pixel electrode in plan view of the substrate, the white light emitting portion corresponding to the green color filter comprises an overlapping area $B_G$ with the pixel electrode in plan view of the substrate; the blue light emitting portion comprises an overlapping area $A_B$ with the pixel electrode in plan view of the substrate, the white light emitting portion corresponding to the blue color filter comprises an overlapping area $B_B$ with the pixel electrode in plan view of the substrate; $A_R:A_G:A_B=\alpha_R:\alpha_G:\alpha_B$; $B_R:B_G:B_B=\beta_R:\beta_G:\beta_B$; $\alpha_R+\beta_R=\alpha_G+\beta_G=\alpha_B+\beta_B=1$; one or more of $\alpha_R$, $\alpha_G$, and $\alpha_B$ is a known parameter.

In another aspect, the present disclosure provides a color filter substrate comprising an array of first pixel units, each first pixel unit comprising a red sub-pixel, a green sub-pixel, and a blue sub-pixel; each first pixel unit comprising a red color filter, a green color filter, and a blue color filter; at least one of the red sub-pixel, the green sub-pixel, and the blue sub-pixel comprising a white sub-pixel portion for enhancing brightness of the at least one sub-pixel.

Optionally, a first white color coordinate and a second white color coordinate are substantially the same. The first white color coordinate is a white color coordinate of combined light of light emitted from the red sub-pixel, the green sub-pixel, and the blue sub-pixel. The second white color coordinate is a white color coordinate of combined light of light emitted from equal area units of the red color filter, the green color filter and the blue color filter.

Optionally, the white sub-pixel portion includes a white color filter.

Optionally, the White color filter is a single integral white color filter corresponding to all three of the red color filter, the green color filter, and the blue color filter.

Optionally, each of the red sub-pixel, the green sub-pixel, and the blue sub-pixel comprises a white sub-pixel portion.

Optionally, at least one of the red sub-pixel, the green sub-pixel, and the blue sub-pixel is a rectangle with a protrusion at a corner.

Optionally, at least one of the red sub-pixel, the green sub-pixel, and the blue sub-pixel is a rectangle with a cut-out at a corner.

In another aspect, the present disclosure provides an array substrate comprising an array of second pixel units, each second pixel unit comprising a red sub-pixel, a green sub-pixel, and a blue sub-pixel; the red sub-pixel comprising a red emitting layer; the green sub-pixel comprises a green emitting layer; and the blue sub-pixel comprises a blue emitting layer; at least one of the red sub-pixel, the green sub-pixel, and the blue sub-pixel comprising a white emitting layer for enhancing brightness of at least one sub-pixel.

Optionally, a first white color coordinate and a second white color coordinate are substantially the same. The first white color coordinate is a white color coordinate of combined light of light emitted from the red sub-pixel, the green sub-pixel, and the blue sub-pixel. The second white color coordinate is a white color coordinate of combined light of light emitted from equal area units of the red emitting layer, the green emitting layer, and the blue emitting layer.

In another aspect, the present disclosure also provides an array substrate comprising an array of second pixel units, each second pixel unit comprising a red sub-pixel, a green sub-pixel, and a blue sub-pixel; each sub-pixel comprises a pixel electrode; at least one of pixel electrodes in the red sub-pixel, the green sub-pixel, and the blue sub-pixel is a rectangle with a protrusion at a corner.

In another aspect, the present disclosure further provides an array substrate comprising an array of second pixel units, each second pixel unit comprising a red sub-pixel, a green sub-pixel, and a blue sub-pixel; each sub-pixel comprises a pixel electrode; at least one of pixel electrodes in the red sub-pixel, the green sub-pixel, and the blue sub-pixel is a rectangle with a cut-out at a corner.

In another aspect, the present disclosure provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
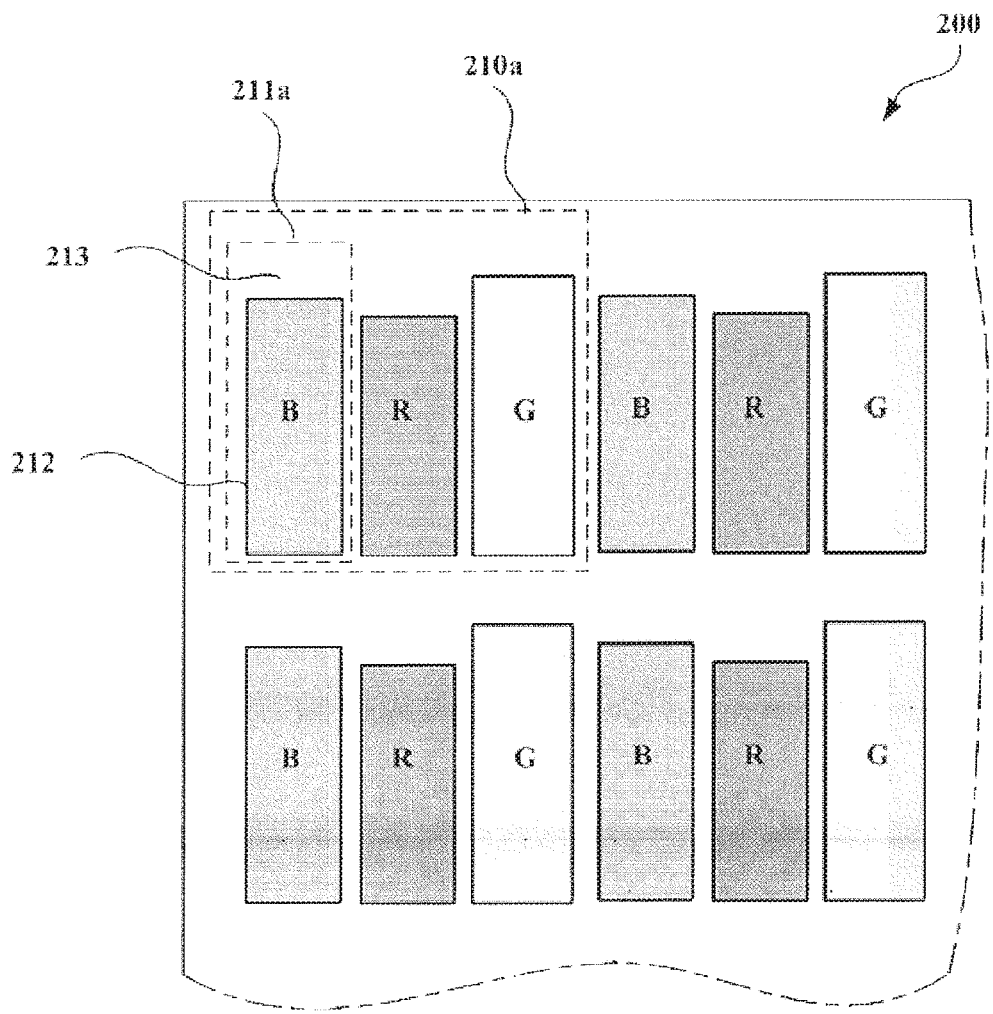
FIG. 1 is a diagram illustrating the structure of a color filter substrate in some embodiments.

The disclosure will now describe more specifically with reference to the following embodiments. It is to be noted that the following descriptions of some embodiments are presented herein far purpose of illustration and description only, it is not intended to be exhaustive or to be limited to the precise form disclosed.

In a conventional RGBW display device, the ratio among R/G/B light brightness is shifted by the inclusion of a white sub-pixel. Consequently, the white balance of the output light is distorted, resulting in false color effect thus affecting the display quality. The term "white balance" refers to a measurement in which the balance among the red, blue, and green colors is adjusted approximately to the color state of natural light so that the color distortion is removed.

The present disclosure provides a superior color filter substrate, a superior array substrate, a superior display panel and a display apparatus having the same, that overcome the disadvantages and shortcoming of the conventional RGBW display substrate, display panel, and display apparatus. Specifically, the present color filter substrate, array substrate, display panel and display apparatus have a greatly improved ratio among brightness of light of different colors that results in optimal white balance, leading to much higher display quality.

In one aspect, the present disclosure provides a display panel. The display panel according to the present disclosure includes an array of pixel units, each of which includes a plurality of sub-pixels (e.g., a red sub-pixel, a green sub-pixel, a blue sub-pixel, optionally a yellow sub-pixel). Each sub-pixel may include one or more portion. In some embodiments, the red sub-pixel includes a red light emitting portion; the green sub-pixel includes a green light emitting portion; the blue sub-pixel includes a blue light emitting portion; and at least one of the red sub-pixel, the green sub-pixel, and the blue sub-pixel includes a white light emitting portion for enhancing brightness of at least one sub-pixel. Optionally, each of the red sub-pixel, the green sub-pixel, and the blue sub-pixel includes a white light emitting portion for enhancing brightness.

In one aspect, the color distortion may be reduced or eliminated by matching a first white color coordinate with a second white color coordinate. The first white color coordinate is obtained by combining light emitted from the red sub-pixel, the green sub-pixel, and the blue sub-pixel. As used herein, the term "light emitted from a sub-pixel" refers to combined light of light emitted from a light emitting portion emitting light of a color of the sub-pixel (e.g., a red light emitting portion, a green light emitting portion, and a blue light emitting portion) and light emitted from a white light emitting portion when that sub-pixel includes a white light emitting portion. For example, light emitted from a red sub-pixel refers to combined light emitted from the red light emitting portion and the white light emitting portion corresponding to and associated with the red sub-pixel; light emitted from the green sub-pixel refers to combined light emitted from the green light emitting portion and the white light emitting portion corresponding to and associated with the green sub-pixel; and light emitted from the blue sub-pixel refers to combined light emitted from the blue light emitting portion and the white light emitting portion corresponding to and associated with the blue sub-pixel. The second white color coordinate is obtained by combining light emitted from equal area units of the red light emitting portion, the green light emitting portion, and the blue light emitting portion. Optionally, the second white color coordinate is obtained by combining light emitted from a red color filter, a green color filter, and a blue color filter each having a same area.

In some embodiments, the first white color coordinate and the second white color coordinate are substantially the same. For example, the first white color coordinate may be expressed as $(X_1, Y_1, Z_1)$ and the second white color coordinate may be expressed as $(X_2, Y_2, Z_2)$. Optionally, $X_1$ deviates from $X_2$ within a range of $\pm 20\%$ of $X_2$ (e.g., $\pm 15\%$ of $X_2$, $\pm 10\%$ of $X_2$, $\pm 5\%$ of $X_2$, $\pm 4\%$ of $X_2$, $\pm 2\%$ of $X_2$, or $\pm 1\%$ of $X_2$).

In some embodiments, the red light emitting portion is a red color filter, the green light emitting portion is a green color filter, and the blue light emitting portion is a blue color filter. Optionally, the red light emitting portion is a portion of the red color filter overlapping with a pixel electrode in the red sub-pixel in plan view of the display panel; the green light emitting portion is a portion of the green color filter overlapping with a pixel electrode in the green sub-pixel in plan view of the display panel; the blue light emitting portion is a portion of the blue color filter overlapping with a pixel electrode in the blue sub-pixel in plan view of the display panel. Accordingly, the second white color coordinate is a white color coordinate of combined light of light emitted from equal area units of the red color filter, the green color filter, and the blue color filter.

In some embodiments, the white light emitting portion is a white color filter. Optionally, the white light emitting portion is a portion of the white color filter overlapping with a corresponding pixel electrode in plan view of the display panel.

In some embodiments, each sub-pixel includes a pixel electrode having a first portion and a second portion; the first portion corresponds to one of the red light emitting portion, the green light emitting portion, and the blue light emitting portion; and the second portion corresponds to the white light emitting portion.

Optionally, at least one of the red color filter, the green color filter, and the blue color filter is a rectangle with a protrusion at a corner. Optionally, at least one of the red color filter, the green color filter, and the blue color filter is a rectangle with a cut-out at a corner. Optionally, all three of the red color filter, the green color filter, and the blue color filter are either a rectangle with a protrusion at a corner or a rectangle with a cut-out at a corner.

In some embodiments, each second pixel unit comprising a red sub-pixel, a green sub-pixel, and a blue sub-pixel; and each sub-pixel includes a pixel electrode. Optionally, at least one of pixel electrodes in the red sub-pixel, the green sub-pixel, and the blue sub-pixel is a rectangle with a protrusion at a corner. Optionally, at least one of pixel electrodes in the red sub-pixel, the green sub-pixel, and the blue sub-pixel is a rectangle with a cut-out at a corner. Optionally, all three pixel electrodes in the red sub-pixel, the green sub-pixel, and the blue sub-pixel are either a rectangle with a protrusion at a corner or a rectangle with a cut-out at a corner.

In another aspect, the present disclosure provides a color filter substrate. A color filter substrate according to the present disclosure includes an array of pixel units, each of which includes a plurality of sub-pixels (e.g., a red sub-pixel, a green sub-pixel, a blue sub-pixel, optionally a yellow sub-pixel). Each sub-pixel may include one or more portion. At least one of the sub-pixels (optionally all sub-pixels) includes a first portion which contains a color filter corresponding to the color of the sub-pixel. For example, a red sub-pixel may include a first portion which contains a red color filter, a green sub-pixel may include a first portion which contains a green color filter, and a blue sub-pixel may include a first portion which contains a blue color filter. Optionally, the first portion is an overlapping portion of the color filter corresponding to the color of the sub-pixel that overlaps with a corresponding pixel electrode in a corresponding array substrate in plan view of the substrate. For example, a red sub-pixel includes a red color filter portion $A_R$ which is a portion of the red color filter in the red sub-pixel overlapping with the pixel electrode in a corresponding array substrate in plan view of the substrate, a green sub-pixel may include a green color filter portion $A_G$ which is a portion of the green color filter in the green sub-pixel overlapping with the pixel electrode in a corresponding array substrate in plan view of the substrate, and a blue sub-pixel may include a blue color filter portion $A_B$ which is a portion of the blue color filter in the blue sub-pixel overlapping with the pixel electrode in a corresponding array substrate in plan view of the substrate. The color filter substrate may be a color filter substrate for any display panel, including, but are not limited to, a liquid crystal display panel and an organic light emitting display panel having color filters.

At least one of the sub-pixels (optionally all sub-pixels) further includes a second portion which is a white sub-pixel portion corresponding to and associated with the at least one sub-pixel. Optionally, the white sub-pixel portion is a white color filter portion that includes a white color filter. Optionally, the white color filter is a transparent color filter. Optionally, the white sub-pixel portion does not include a white color filter. For example, the white light emitted from the white sub-pixel portion is provided by a backlight (e.g., in a LCD) or by a white light emitting layer portion (e.g., in an OLED). Optionally, the white sub-pixel portion is an overlapping portion that overlaps with a corresponding pixel electrode in a corresponding array substrate in plan view of the substrate.

Optionally, a red sub-pixel may include a red color filter portion and a white sub-pixel portion. Optionally, a green sub-pixel may include a green color filter portion and a white sub-pixel portion. Optionally, a blue sub-pixel may include a blue color filter portion and a white sub-pixel portion.

In one aspect, the color distortion in a display panel having a color filter substrate may be reduced or eliminated by matching a first white color coordinate with a second white color coordinate. The first white color coordinate is obtained by combining light emitted from the red sub-pixel, the green sub-pixel, and the blue sub-pixel. The second white color coordinate is obtained by combining light emitted from a red color filter, a green color filter, and a blue color filter each having a same surface area (e.g., by stacking all three color filters). As used herein, the term "light emitted from a sub-pixel" refers to combined light of light emitted from a light emitting portion emitting light of a color of the sub-pixel (e.g., a red color filter portion, a green color filter portion, and a blue color filter portion) and light emitted from a white light emitting portion (e.g., a white sub-pixel portion) when that sub-pixel includes a white light emitting portion. For example, light emitted from a red sub-pixel refers to combined light emitted from the red color filter portion and the white sub-pixel portion corresponding to and associated with the red sub-pixel; light emitted from the green sub-pixel refers to combined light emitted from the green color filter portion and the white sub-pixel portion corresponding to and associated with the green sub-pixel; and light emitted from the blue sub-pixel refers to combined light emitted from the blue color filter portion and the white sub-pixel portion corresponding to and associated with the blue sub-pixel. The second white color coordinate is obtained by combining light emitted from multiple color filters within the pixel unit, each having a same surface area. Optionally, the second white color coordinate is obtained by combining light emitted from a red color filter, a green color filter, and a blue color filter each having a same area.

In some embodiments, the first white color coordinate and the second white color coordinate are substantially the same. For example, the first white color coordinate may be expressed as $(X_1, Y_1, Z_1)$ and the second white color coordinate may be expressed as $(X_2, Y_2, Z_2)$. Optionally, $X_1$ deviates from $X_2$ within a range of ±20% of $X_2$ (e.g., ±15% of $X_2$, ±10% of $X_2$, ±5% of $X_2$, ±4% of $X_2$, ±2% of $X_2$, or ±1% of $X_2$).

In another aspect, the present disclosure provides an array substrate. In some embodiments, the array substrate includes an array of second pixel units. Each second pixel unit includes a plurality of sub-pixels (e.g., a red sub-pixel, a green sub-pixel, a blue sub-pixel, optionally a yellow sub-pixel).

In some embodiments, each sub-pixel includes a pixel electrode. Optionally, at least one of pixel electrodes in the red sub-pixel, the green sub-pixel, and the blue sub-pixel is a rectangle with a protrusion at a corner. Optionally, at least one of pixel electrodes in the red sub-pixel, the green sub-pixel, and the blue sub-pixel is a rectangle with a cut-out at a corner.

In some embodiments, the array substrate is an array substrate in an organic light emitting display panel. Optionally, the red sub-pixel includes a red emitting layer; the green sub-pixel includes a green emitting layer; and the blue sub-pixel includes a blue emitting layer, and at least one of the red sub-pixel, the green sub-pixel, and the blue sub-pixel includes a white emitting layer for enhancing brightness of at least one sub-pixel. Optionally, each of the red sub-pixel, the green sub-pixel, and the blue sub-pixel includes a white light emitting layer for enhancing brightness of at least one sub-pixel.

In one aspect, the color distortion in a display panel having a present array substrate may be reduced or eliminated by matching a first white color coordinate with a second white color coordinate. The first white color coordinate is obtained by combining light emitted from the red sub-pixel, the green sub-pixel, and the blue sub-pixel. The second white color coordinate is obtained by combined light of light emitted from equal area units of the red emitting layer, the green emitting layer, and the blue emitting layer. As used herein, the term "light emitted from a sub-pixel" refers to combined light of light emitted from a light emitting portion emitting light of a color of the sub-pixel (e.g., a red emitting layer, a green emitting layer, and a blue emitting layer) and light emitted from a white light emitting portion (e.g., a white light emitting layer) when that sub-pixel includes a white light emitting portion. For example, light emitted from a red sub-pixel refers to combined light emitted from the red emitting layer and the white emitting layer corresponding to and associated with the red sub-pixel; light emitted from the green sub-pixel refers to combined light emitted from the green emitting layer and the white emitting layer corresponding to and associated with the green sub-pixel; and light emitted from the blue sub-pixel refers to combined light emitted from the blue emitting layer and the white emitting layer corresponding to and associated with the blue sub-pixel. The second white color coordinate is obtained by combining light emitted from equal area units of multiple emitting layer each emitting light of a color of the sub-pixel within the pixel unit (excluding the white emitting layer). Optionally, the second white color coordinate is obtained by combining light emitted from equal area units of a red emitting layer, a green emitting layer, and a blue emitting layer.

In some embodiments, the first white color coordinate and the second white color coordinate are substantially the same. For example, the first white color coordinate may be expressed as $(X_1, Y_1, Z_1)$ and the second white color coordinate may be expressed as $(X_2, Y_2, Z_2)$. Optionally, $X_1$ deviates from $X_2$ within a range of ±20% of $X_2$ (e.g., ±15% of $X_2$, ±10% of $X_2$, ±5% of $X_2$, ±4% of $X_2$, ±2% of $X_2$, or ±1% of $X_2$).

FIG. 1 is a diagram illustrating the structure of a color filter substrate in some embodiments. Referring to FIG. 1, the color filter substrate 200 in the embodiment includes a plurality of first pixel units 210a. Each first pixel unit 210a includes a plurality of sub-pixels of different colors 211a, e.g., a red sub-pixel R, a green sub-pixel G, and a blue sub-pixel B. A portion of each sub-pixel corresponds to a color filter of a same color 212, and another portion of each sub-pixel corresponds to a white sub-pixel portion 213 (e.g., a white color filter portion 213).

In some embodiments, a first white color coordinate obtained by combining light emitted from the red sub-pixel, the green sub-pixel, and the blue sub-pixel; and a second white color coordinate obtained by combining light emitted from a red color filter, a green color filter, and a blue color filter each having a same area (e.g., by stacking all three color filters) are substantially the same.

In some embodiments, the white sub-pixel portion of each sub-pixel is a white color filter portion. Optionally, the white color filter is made of a transparent optical adhesive. Optionally, the color filter substrate includes one white color filter block corresponding to each R/G/B color filter. For example, the color filter substrate contains three separate white color filter blocks spaced apart, each of which corresponding to and associated with one of R/G/B color filters. Optionally, the color filter substrate includes one single integral white color filter corresponding to all three R/G/B color filters (see, e.g., the white color filter 213 in FIG. 1).

Specifically, the red color filter has an overlapping area $A_R$ with the pixel electrode in plan view of the substrate, the white sub-pixel portion (e.g., the white color filter portion) corresponding to the red color filter has an overlapping area $B_R$ with the pixel electrode in plan view of the substrate; the green color filter has an overlapping area $A_G$ with the pixel electrode in plan view of the substrate, the white sub-pixel portion(e.g., the white color filter portion) corresponding to the green color filter has an overlapping area $B_G$ with the pixel electrode in plan view of the substrate; and the blue color filter has an overlapping area $A_B$ with the pixel electrode in plan view of the substrate, the white sub-pixel portion(e.g., the white color filter portion) corresponding to the blue color filter has an overlapping area $B_B$ with the pixel electrode in plan view of the substrate.

In some embodiments, $A_R:A_G:A_B=\alpha_R:\alpha_G:\alpha_B$; $B_R:B_G:B_B=\beta_R:\beta_G:\beta_B$; and $\alpha_R+\beta_R=\alpha_G+\beta_G=\alpha_B+\beta_B=1$. Optionally, one or more of $\alpha_R$, $\alpha_G$ and $\alpha_B$ is a known parameter.

Various embodiments of sub-pixel arrangement may be practiced. The color filter substrate as shown in FIG. 1 includes a repeating pattern of a blue color filter, a red color filter, and a green color filter in each first pixel unit 210a. As shown in FIG. 1, the white sub-pixel portion 213 (e.g., the white color filter portion 213) corresponding to each color sub-pixel 212 is arranged on top of each color sub-pixel 212. Any one of unknown parameter among $\alpha_R$, $\alpha_G$, $\alpha_B$, $\beta_R$, $\beta_G$, and $\beta_B$ can be derived from the known parameters.

For example, in some color filter substrates, the color coordinates of the red color filter (R), the green color filter (G), the blue color filter (B), and the white color filter (W) are:

$$R=(X_R,Y_R,Z_R)=(37.1,18.3,1.0)$$

$$G=(X_G,Y_G,Z_G)=(27.1,56.0,11.2)$$

$$B=(X_B,Y_B,Z_B)=(16.5,13.0,90.1)$$

$$W=(X_W,Y_W,Z_W)=(96.8,98.9,114.8).$$

Accordingly, the white color coordinate obtained by combining light emitted from a red color filter, a green color filter, and a blue color filter having a same area is:

$$W_1=(XW_1,YW_1,ZW_1)$$

wherein $XW_1=(X_R+X_G+X_B)/3$;

$YW_1=(Y_R+Y_G+Y_B)/3$; and $ZW_1=(Z_R+Z_G+Z_B)/3)$ $W_1=(XW_1,YW_1,ZW_1)=((X_R+X_G+X_B)/3,(Y_R+Y_G+Y_B)/3,(Z_R+Z_G+Z_B)/3))=(26.9,29.1,34.1)$.

The above white color coordinate $W_1$ can be converted into a CIE1931 color coordinate: $(xW_1, yW_1, YW_1)=(0.299, 0.323, 29.1)$.

In one example, $\alpha_R/\beta_R=0.65/0.35$; and the color coordinate of light emitted from the red sub-pixel is:

$$R'=(X_{R'},Y_{R'},Z_{R'});$$

wherein $X_{R'}=(X_R*0.65)+(X_W*0.35)$;

$Y_{R'}=(Y_R*0.65)+(Y_W*0.35)$;

$Z_{R'}=(Z_R*0.65)+(Z_W*0.35)$;

$R'=(X_{R'},Y_{R'},Z_{R'})=(((X_R*0.65)+(X_W*0.35)),((Y_R*0.65)+(Y_W*0.35)),((Z_R*0.65)+(Z_W*0.35)))$;

wherein $(X_R, Y_R, Z_R)$ is the color coordinate of light emitted from the red color filter portion; $(X_W, Y_W, Z_W)$ is the color coordinate of light emitted from the white sub-pixel portion (e.g., the white color filter portion).

Similarly, the color coordinate of light emitted from the green sub-pixel is:
$G'=(X_{G'}, Y_{G'}, Z_{G'})=(((X_G*\alpha_G)+(X_W*\beta_G)), ((Y_G*\alpha_G)+(Y_W*\beta_G)), ((Z_G*\alpha_G)+(Z_W*\beta_G)))$; wherein $(X_G, Y_G, Z_G)$ is the color coordinate of light emitted from the green color filter portion; $(X_W, Y_W, Z_W)$ is the color coordinate of light emitted from the white sub-pixel portion (e.g., the white color filter portion).

The color coordinate of light emitted from the green sub-pixel is:
$B'=(X_{B'}, Y_{B'}, Z_{B'})=(((X_B*\alpha_B)+(X_W*\beta_B)), ((Y_B*\alpha_B)+(Y_W*\beta_B)), ((Z_B*\alpha_B)+(Z_W*\beta_B)))$; wherein $(X_B, Y_B, Z_B)$ is the color coordinate of light emitted from the blue color filter portion; $(X_W, Y_W, Z_W)$ is the color coordinate of light emitted from the white sub-pixel portion (e.g., the white color filter portion).

Accordingly, the white color coordinate obtained by combining light emitted from the red sub-pixel, the green sub-pixel, and the blue sub-pixel is expressed as:

$$W'=(XW',YW',ZW')=((X_{R'}+X_{G'}+X_{B'})/3,(Y_{R'}+Y_{G'}+Y_{B'})/3,(Z_{R'}+X_{G'}+Z_{B'})/3)).$$

The above white color coordinate $W'$ can be converted into a CIE1931 color coordinate: $(xW', yW', YW')$.

In some embodiments, $xW_1=xW'$; $yW_1=YW'$; $YW_1=YW'$. Accordingly, it can be derived that of $\alpha_G=0.75$; $\beta_G=0.25$; $\alpha_B=0.73$; and $\beta_B=0.27$. Thus, $\alpha_R:\alpha_G:\alpha_B=0.65: 0.75:0.73$; and $\beta_R:\beta_G:\beta_B=0.35:0.25:0.27$. Based on these calculations, the proportion of color filters and white filter in the color filter substrate can be optimized to achieve enhanced white balance in the color filter substrate and enhanced display quality in a display apparatus having the color filter substrate.

By having a white sub-pixel portion 213 in each sub-pixel 211a, an enhanced light transmission rate can be achieved. By keeping a first white color coordinate obtained by combining light emitted from the red sub-pixel, the green sub-pixel, and the blue sub-pixel; and a second white color coordinate obtained by combining light emitted from a red color filter, a green color filter, and a blue color filter each having a same area (e.g., by stacking all three color filters) substantially the same, the ratio among light brightness of different colors can be greatly improved, resulting in optimal white balance and much higher display quality.

Figure 5:
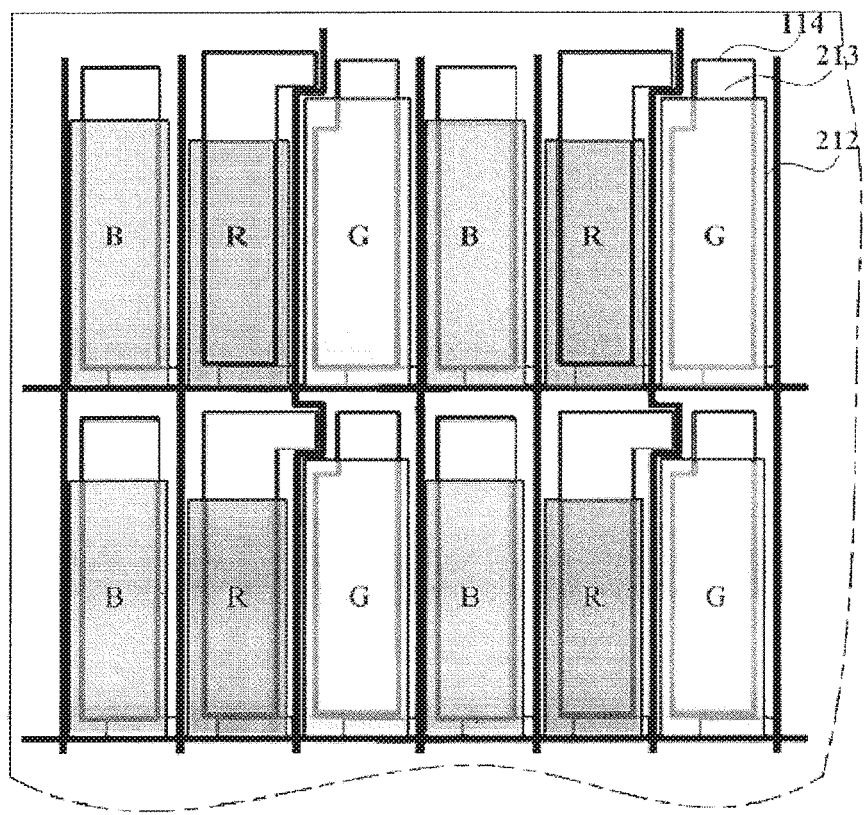
FIG. 5 is a diagram illustrating the structure of a display panel in some embodiments.
Figure 6:
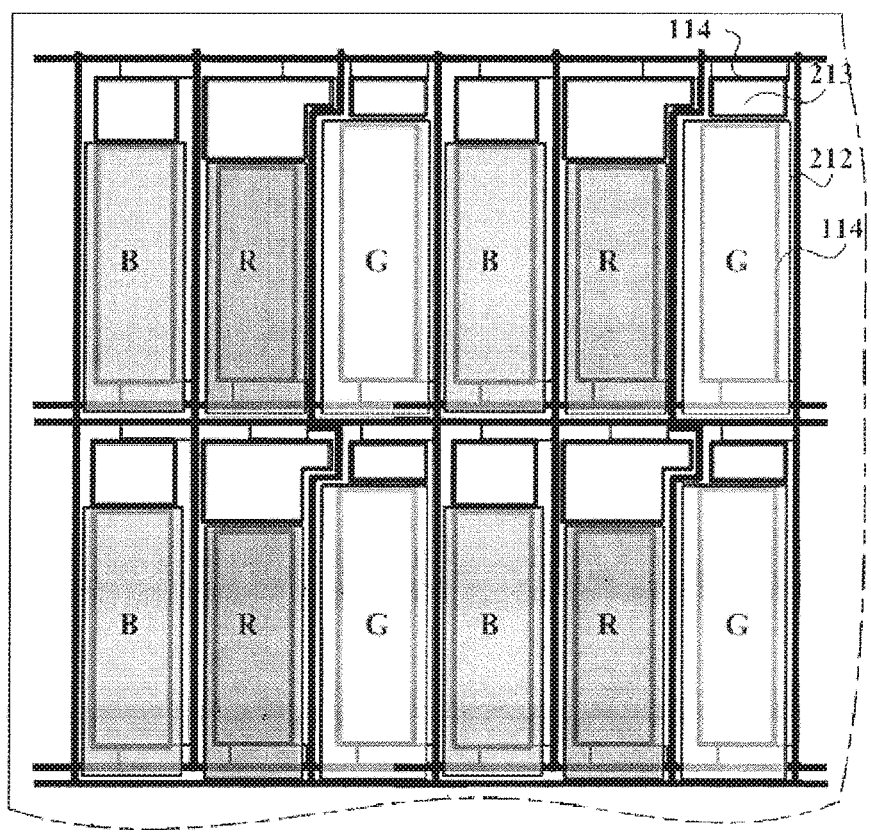
FIG. 6 is a diagram illustrating the structure of a display panel in some embodiments.

FIGS. 5 and 6 are diagrams illustrating the structure of some display panels in some embodiments. As shown in FIGS. 5 and 6, each sub-pixel (e.g., R, G, and B) includes a color filter portion 212 and a white sub-pixel portion (e.g., a white color filter portion) 213. The color filters and/or the sub-pixels may have any appropriate shape. Optionally, the color tilter and/or the sub-pixel has a rectangular shape. Optionally, the color filter and/or the sub-pixel is a rectangle with a protrusion at a corner. Optionally, the color filter and/or the sub-pixel is a rectangle with a "cut-out" at a corner.

Figure 2:
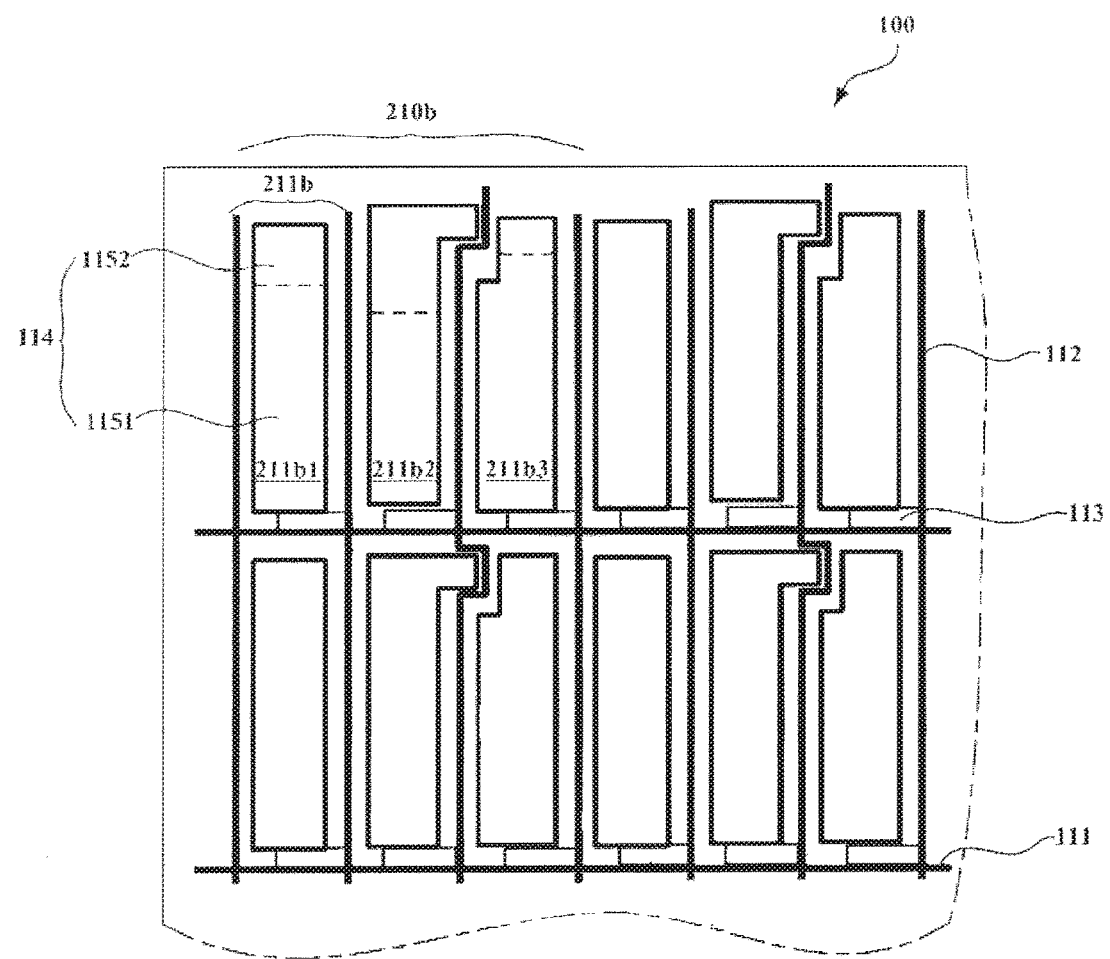
FIG. 2 is a diagram illustrating the structure of an array substrate in some embodiments.

FIG. 2 is a diagram illustrating the structure of an array substrate in some embodiments. Referring to FIG. 2, the array substrate 100 in the embodiment includes a second pixel unit 210b. Each pixel unit 210b includes a plurality of sub-pixels 211b, e.g., a sub-pixel 211b1 corresponding to the red sub-pixel (R) in the color filter substrate 200, a sub-pixel 211b2 corresponding to the green sub-pixel (G) in the color filter substrate 200, and a sub-pixel 211b3 corresponding to the blue sub-pixel (B) in the color filter substrate 200. Each sub-pixel 211b in the array substrate includes a pixel electrode 114. Each sub-pixel 211a in the color filter substrate includes a color filter portion and a white sub-pixel portion.

Optionally, each pixel electrode 114 includes a first portion 1151 corresponding to the color filter portion of the each sub-pixel 211a in the color filter substrate and a second portion 1152 corresponding to the white sub-pixel portion of the each sub-pixel 211a in the color filter substrate.

Optionally, a first white color coordinate obtained by combining light emitted from the red sub-pixel, the green sub-pixel, and the blue sub-pixel of the color filter substrate; and a second white color coordinate obtained by combining light emitted from a red color filter, a green color filter, and a blue color filter each having a same area (e.g., by stacking all three color filters) are substantially the same. The red sub-pixel in the color filter substrate includes a red color filter portion corresponding to the first portion 1151 of a corresponding pixel electrode and a white sub-pixel portion corresponding to the second portion 1152 of a corresponding pixel electrode. The green sub-pixel in the color filter substrate includes a green color filter portion corresponding to the first portion 1151 of a corresponding pixel electrode and a white sub-pixel portion corresponding to the second portion 1152 of a corresponding pixel electrode. The blue sub-pixel in the color filter substrate includes a blue color filter portion corresponding to the first portion 1151 of a corresponding pixel electrode and a white sub-pixel portion corresponding to the second portion 1152 of a corresponding pixel electrode.

In some embodiments, the color filter in the color filter substrate has an area larger than that of the corresponding pixel electrode in the array substrate. A display panel (e.g., a liquid crystal display panel or an organic light emitting display panel) is formed by assembling the color filter substrate and the array substrate together. Typically, the R/G/B color filter and/or the white color filter include an edge portion that extends over the overlapping portion which overlaps with the corresponding pixel electrode. Also, it is more technically demanding to fabricating a high resolution color filters substrate than an array substrate having the same resolution. Thus, in some embodiments, the control of the relative ratio between a color filter portion and a white sub-pixel portion in a sub-pixel is achieved by controlling the respective overlapping portions in the corresponding pixel electrode. Optionally, the control of the relative ratio between a color filter portion and a white sub-pixel portion in a sub-pixel is achieved by controlled the ratio between the first portion 1151 and the second portion 1152 of a corresponding pixel electrode. The first portion 1151 corresponds to the color filter portion of the each sub-pixel 211a in the color filter substrate and the second portion 1152 corresponds to the white sub-pixel portion of the each sub-pixel 211a in the color filter substrate. This design obviates the need for high resolution fabrication of color filters. For example, the color filters may all have a rectangular shape of an equal area, and the white filters may all have an equal area. The respective overlapping portion with the pixel electrode determines the area of the color filter portion and the area of the area of the white sub-pixel portion (e.g., the white color filter portion). Without involving a complicated fabricating process, the present substrate and display panel achieve art optimal white balance and superior display quality.

Optionally, the array substrate includes a plurality of gate lines 111 and a plurality of data lines 112 crossing over each other, dividing the array substrate into a plurality of second pixel units 210b and defining a plurality of sub-pixels 211b within each second pixel unit 210b.

Specifically, the first portion 1151 of the pixel electrode has an overlapping area $A_R$ with the red color filter in plan view of the substrate, the second portion 1152 of the pixel electrode has an overlapping area $B_R$ with the white sub-pixel portion e.g., the white color filter portion) corresponding to the red color filter; the first portion 1151 of the pixel electrode has an overlapping area $A_G$ with the green color filter in plan view of the substrate, the second portion 1152 of the pixel electrode has an overlapping area $B_G$ with the white sub-pixel portion (e.g., the white color filter portion) corresponding to the green color filter; and the first portion 1151 of the pixel electrode has an overlapping area $A_B$ with the blue color filter in plan view of the substrate, the second portion 1152 of the pixel electrode has an overlapping area $B_B$ with the white sub-pixel portion (e.g., the white color filter portion) corresponding to the blue color filter.

In some embodiments, $A_R:A_G:A_B=\alpha_R:\alpha_G:\alpha_B$; $B_R:B_G:B_B=\beta_R:\beta_G:\beta_B$; and $\alpha_R+\beta_R=\alpha_G+\beta_G=\alpha_B+\beta_B=1$. Optionally, one or more of $\alpha_R$, $\alpha_G$; and $\alpha_B$ is a known parameter.

In a display panel having the array substrate 100 and the corresponding color filter substrate 200, an enhanced light transmission rate can be achieved. By keeping a first white color coordinate obtained by combining light emitted from the red sub-pixel, the green sub-pixel, and the blue sub-pixel; and a second white color coordinate obtained by combining light emitted from a red color filter, a green color filter, and a blue color filter each having a same area (e.g., by stacking all three color filters) substantially the same, the ratio among light brightness of different colors can be greatly improved, resulting in optimal white balance and much higher display quality.

In some embodiments, the plurality of gate lines include a plurality of single gate lines (see, e.g., FIG. 2). The pixel electrode 114 includes a first portion 1151 corresponding to the color filter portion of a sub-pixel in the color filter substrate, and a second portion 1152 corresponding to the white sub-pixel portion of a sub-pixel in the color filter substrate. Optionally, the first portion 1151 and the second portion. 1152 have an integral structure. Each sub-pixel includes one thin film transistor 113. The gate electrode of the thin film transistor 113 is electrically connected to a single gate line corresponding to the sub-pixel. The source electrode of the thin film transistor 113 is electrically connected to the date line corresponding to the sub-pixel, and the drain electrode of the thin film transistor 113 is electrically connected to the pixel electrode 114. As compared to the conventional display panel, a display panel having an array substrate of this type of structure has a minimized number of thin film transistors. Accordingly, the display panel has a better aperture ratio and lower manufacturing costs.

Figure 3:
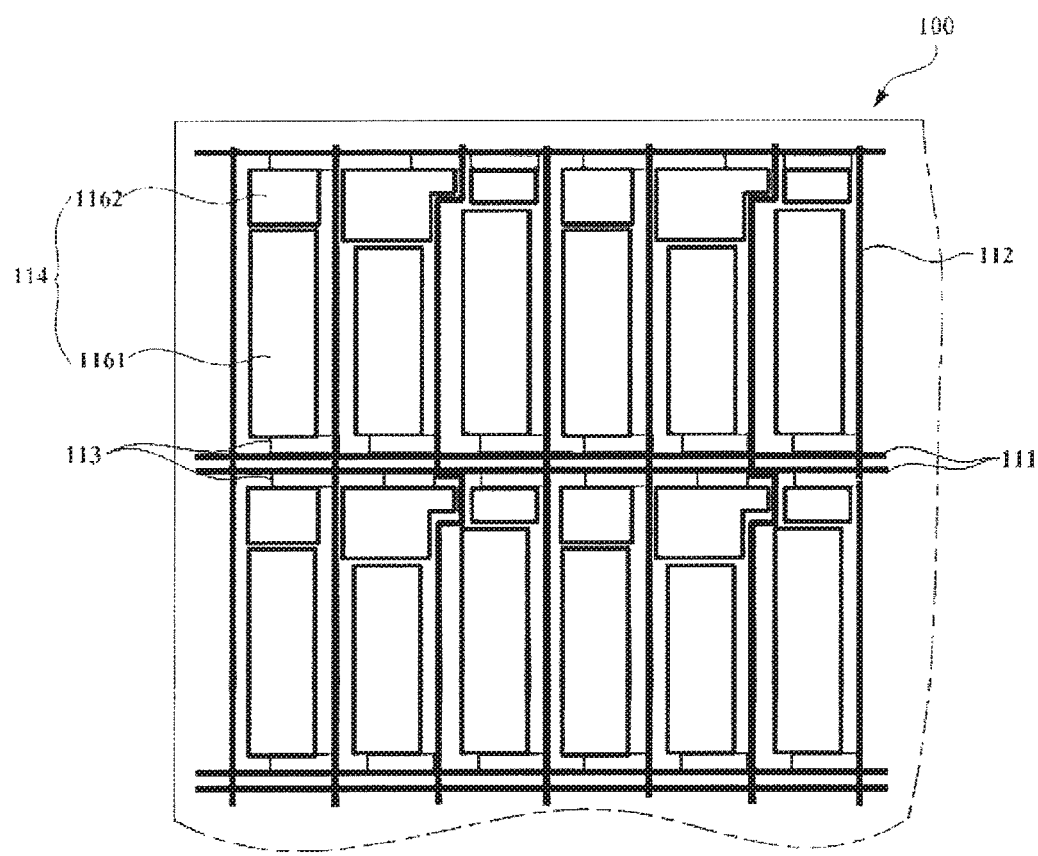
FIG. 3 is a diagram illustrating the structure of an array substrate in some embodiments.

In some embodiments, the plurality of gate lines include two single gate lines and a plurality of dual gate lines between the two single gate lines (see, e.g., FIG. 3). The pixel electrode 114 includes a first portion 1161 corresponding to the color filter portion of a sub-pixel in the color filter substrate, and a second portion 1162 corresponding to the white sub-pixel portion of a sub-pixel in the color filter substrate. The first portion 1161 and the second portion 1162 are spaced apart, e.g., not electrically connected. Each sub-pixel includes two thin film transistors 113. Two gate electrodes of the two thin film transistors 113 within each sub-pixel are electrically connected to the two gate lines adjacent to the sub-pixel, respectively. Two source electrodes of the two thin film transistors 113 within each sub-pixel are electrically connected to two data lines corresponding to the sub-pixel, respectively. Two drain electrodes of the two thin film transistors 113 within each sub-pixel are electrically connected to the first portion 1161 and the second portion 1162 of the pixel electrode, respectively. A display panel having an array substrate of this type of structure uses two thin film transistors to control the voltages on the first portion 1161 and the second portion 1162, respectively. Targeted control of the voltages on the first portion 1161 and the second portion 1162 may be achieved in this type of display panel. As a consequence, the brightness of light emitted from portions of color filter substrate corresponding to the first portion 1161 and the second portion 1162 can be controlled separately. Accordingly, the display's color saturation can be greatly enhanced.

Figure 4:
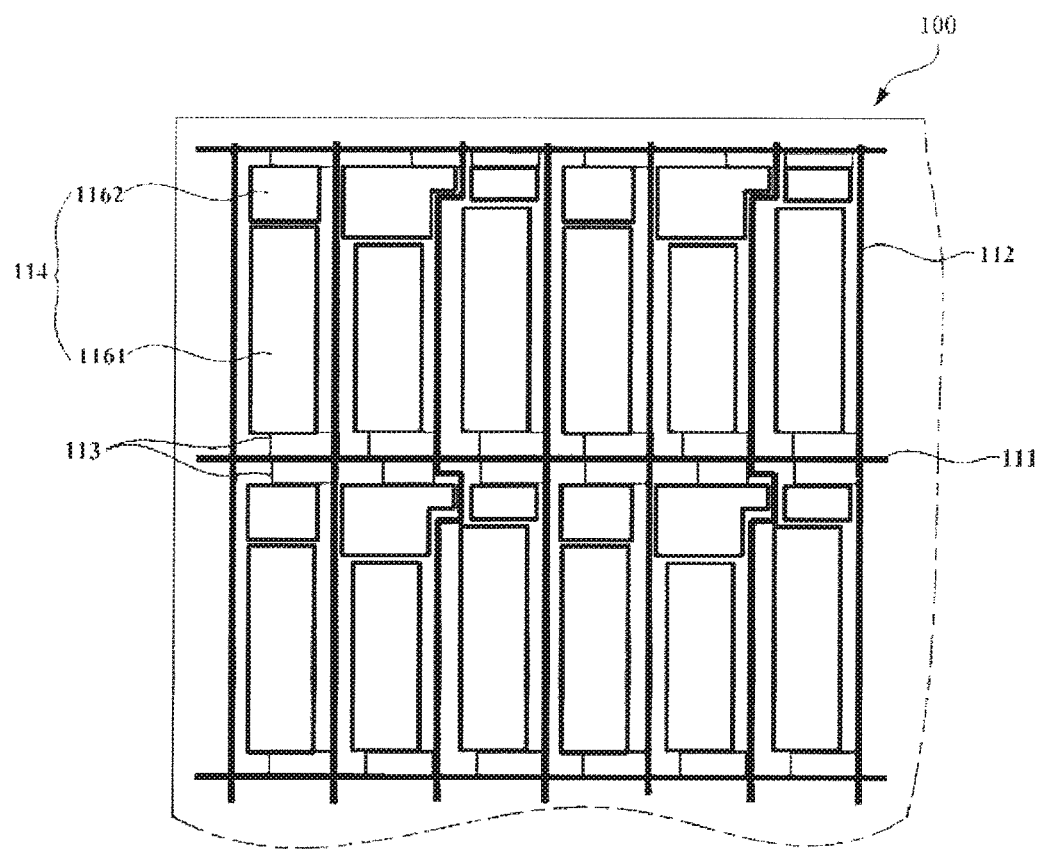
FIG. 4 is a diagram illustrating the structure of an way substrate in some embodiments.

FIG. 4 is a diagram illustrating the structure of an array substrate in some embodiments. Referring to FIG. 4, the array substrate in the embodiment includes a plurality of single gate lines 111, and a pixel electrode including a first portion 1161 and a second portion 1162 spaced apart. Each sub-pixel includes two thin film transistors 113. Two gate electrode of the two thin film transistor 113 within each sub-pixel are electrically connected to the two gate lines adjacent to the sub-pixel, respectively. Two source electrodes of the two thin film transistor 113 within each sub-pixel are electrically connected to two data lines corresponding to the sub-pixel, respectively. Two drain electrodes of the two thin film transistor 113 within each sub-pixel are electrically connected to the first portion 1161 and the second portion 1162 of the pixel electrode, respectively.

The pixel electrode 114 may have any appropriate shape. Optionally, the pixel electrode 114 has a rectangular shape (see, e.g., the pixel electrode in the first sub-pixel 211$b$1 in FIG. 2). Optionally, the pixel electrode 114 is rectangle with a protrusion at a corner (see, e.g., the pixel electrode in the first sub-pixel 211$b$2 in FIG. 2). Optionally, the pixel electrode 114 is a rectangle with a "cut-out" at a corner (sec, e.g., the pixel electrode in the first sub-pixel 211$b$3 in FIG. 2).

The data line may have any appropriate design. Optionally, the data line has a shape compatible with the shape of the pixel electrode, as shown in FIGS. 2 and 3. This type of data line structure results in an optimized sub-pixel structure, resulting in an improved aperture ratio.

In another aspect, the present disclosure provides a display panel having a color filter substrate and/or an array substrate described herein. The display panel is formed by assembling a color filter substrate and an array substrate. In another aspect, the present disclosure also provides a display apparatus having a display panel described herein. Examples of display apparatuses include, but are not limited to, a liquid crystal monitor, a liquid crystal television, a tablet computer, etc.

In the present display panel and the present display apparatus, an enhanced light transmission rate can be achieved. By keeping a first white color coordinate obtained by combining light emitted from the red sub-pixel, the green sub-pixel, and the blue sub-pixel; and a second white color coordinate obtained by combining light emitted from a red color filter, a green color filter, and a blue color filter each having a same area (e.g., by stacking all three color filters) substantially the same, the ratio among light brightness of different colors can be greatly improved, resulting in optimal white balance and much higher display quality.

The display panel and the display apparatus of the present disclosure may be a liquid crystal display panel and display apparatus or an organic light emitting display panel and display apparatus.

In some embodiments, the organic light emitting display panel includes a plurality of pixel units, each pixel unit includes a plurality of sub-pixels of different colors, e.g., a red sub-pixel, a green sub-pixel, a blue sub-pixel. Each sub-pixel includes a first light emitting layer for emitting a light of color and a second light emitting layer for emitting a white light. For example, the first light emitting layer may be a red light emitting layer, a green light emitting layer or a blue light emitting layer. In some embodiments, a first white color coordinate obtained by combining light emitted from the red sub-pixel, the green sub-pixel, and the blue sub-pixel; and a second white color coordinate obtained by combining light emitted from a red light emitting layer, a green light emitting layer, and a blue light emitting layer each having a same area (e.g., by stacking all three color filters) are substantially the same.

Specifically, the red sub-pixel has a red light emitting layer having an area $A_R$ in plan view of the substrate and a white light emitting layer having an area $B_R$ in plan view of the substrate; the green sub-pixel has a green light emitting layer having an area $A_G$ in plan view of the substrate and a white light emitting layer having an area $B_G$ in plan view of the substrate; the blue sub-pixel has a blue light emitting layer having an area $A_B$ in plan view of the substrate and a white light emitting layer having an area $B_B$ in plan view of the substrate.

In some embodiments, $A_R:A_G:A_B=\alpha_R:\alpha_G:\alpha_B$; $B_R:B_G:B_B=\beta_R:\beta_G:\beta_B$; and $\alpha_R+\beta_R=\alpha_G+\beta_G=\alpha_B+\beta_B=1$. Optionally, one or more of $\alpha_R$, $\alpha_G$, and $\alpha_B$ is a known parameter.

In another aspect, the present disclosure provides a display apparatus having the organic light emitting display panel described herein.

An organic light emitting display panel and display apparatus have many advantages similar to those of a liquid crystal display panel and display apparatus. For example, in the present organic light emitting display panel and display apparatus, an enhanced light transmission rate can be achieved. By keeping the first white color coordinate the second white color coordinate substantially the same, the ratio among light brightness of different colors can be greatly improved, resulting in optimal white balance and much higher display quality.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising an array of pixel units, each pixel unit comprising a red sub-pixel, a green sub-pixel, and a blue sub-pixel;
   the red sub-pixel comprising a first pixel electrode; the green sub-pixel comprising a second pixel electrode; and the blue sub-pixel comprising a third pixel electrode;
   wherein the red sub-pixel comprises a red light emitting region configured to emit red light and a first white light emitting region configured to emit white light;
   the green sub-pixel comprises a green light emitting region configured to emit green light and a second white light emitting region configured to emit white light;
   the blue sub-pixel comprises a blue light emitting region configured to emit blue light and a third white light emitting region configured to emit white light;
   a projection on the display panel of the first pixel electrode substantially overlaps with that of the red light emitting region resulting in an overlapping area $A_R$ and with that of the first white light emitting region resulting in an overlapping area $B_R$;
   a projection on the display panel of the second pixel electrode substantially overlaps with that of the green light emitting region resulting in an overlapping area $A_G$ and with that of the second white light emitting region resulting in an overlapping area $B_G$; and
   a projection on the display panel of the third pixel electrode substantially overlaps with that of the blue light emitting region resulting in an overlapping area $A_B$ and with that of the third white light emitting region resulting in an overlapping area $B_B$;
   $A_R:A_G:A_B$ is substantially the same as $\alpha_R:\alpha_G:\alpha_B$;
   $B_R:B_G:B_B$ is substantially the same as $\beta_R:\beta_G:\beta_B$;
   $(\alpha_R+\beta_R)$, $(\alpha_G+\beta_G)$, and $(\alpha_B+\beta_B)$ are substantially equal to 1; and
   one or more of $\alpha_R$, $\alpha_G$ and $\alpha_B$ is a known parameter.

2. The display panel of claim 1,
   wherein the red sub-pixel comprises a red color filter in the red light emitting region and a first white color filter in the first white light emitting region, the green sub-pixel comprises a green color filter in the green light emitting region and a second white color filter in the second white light emitting region, the blue sub-pixel comprises a blue color filter in the blue light emitting region and a third white color filter in the third white light emitting region.

3. The display panel of claim 1, wherein
   the first pixel electrode comprises a first pixel sub-electrode and a second pixel sub-electrode spaced apart from each other, the second pixel electrode comprises a third pixel sub-electrode and a fourth sub-electrode spaced apart from each other, the third pixel electrode comprises a fifth pixel sub-electrode and a sixth pixel sub-electrode spaced apart from each other;
   a projection on the display panel of the first pixel sub-electrode substantially overlaps with that of the red light emitting region resulting in the overlapping area $A_R$;
   a projection on the display panel of the second pixel sub-electrode substantially overlaps with that of the first white light emitting region resulting in the overlapping area $B_R$;
   a projection on the display panel of the third pixel sub-electrode substantially overlaps with that of the green light emitting region resulting in the overlapping area $A_G$;
   a projection on the display panel of the fourth pixel sub-electrode substantially overlaps with that of the second white light emitting region resulting in the overlapping area $B_G$; and
   a projection on the display panel of the fifth pixel sub-electrode substantially overlaps with that of the blue light emitting region resulting in an overlapping area $A_B$; and
   a projection on the display panel of the sixth pixel sub-electrode substantially overlaps with that of the third white light emitting region resulting in the overlapping area $B_B$.

4. The display panel of claim 1,
   wherein the red sub-pixel comprises a red emitting layer in the red light emitting region and a first white light emitting layer in the first white light emitting region, the green sub-pixel comprises a green emitting layer in the green light emitting region and a second white light emitting layer in the second white light emitting region, the blue sub-pixel comprises a blue emitting layer in the blue light emitting region and a third white light emitting layer in the third white light emitting region.

5. The display panel of claim 1, wherein the first pixel electrode is an integral pixel electrode, the second pixel electrode is an integral pixel electrode, and the third pixel electrode is an integral pixel electrode.

6. A display apparatus, comprising the display panel according to claim 1.

7. The display panel of claim 1, wherein the display panel is a liquid crystal display panel.

8. The display panel of claim 2, wherein at least one of the red color filter, the green color filter, and the blue color filter is a rectangle with a protrusion at a corner.

9. The display panel of claim 2, wherein at least one of the red color filter, the green color filter, and the blue color filter is a rectangle with a cut-out at a corner.

10. The display panel of claim 2, wherein
the projection on the display panel of the first pixel electrode substantially overlaps with that of the red color filter resulting in the overlapping area $A_R$ and with that of the first white color filter resulting in the overlapping area $B_R$;
the projection on the display panel of the second pixel electrode substantially overlaps with that of the green color filter resulting in the overlapping area $A_G$ and with that of the second white color filter resulting in the overlapping area $B_G$; and
the projection on the display panel of the third pixel electrode substantially overlaps with that of the blue color filter resulting in the overlapping area $A_B$ and with that of the third white color filter resulting in the overlapping area $B_B$.

11. The display panel of claim 3, further comprising a plurality of single gate lines and a plurality of data lines crossing over each other, defining a plurality of sub-pixels;
each sub-pixel comprises a first thin film transistor and a second thin film transistor, and are adjacent to a first adjacent gate line on a first side of the each sub-pixel and a second adjacent gate line on a second side of the each sub-pixel;
a gate electrode of the first thin film transistor is electrically connected to the first adjacent gate line;
a gate electrode of the second thin film transistor is electrically connected to the second adjacent gate line;
a source electrode of the first thin film transistor is electrically connected to a first data line;
a source electrode of the second thin film transistor is electrically connected to a second data line; and
drain electrodes of the first thin film transistor and the second thin film transistor are electrically connected to two sub-electrodes of a same pixel electrode; and
a drain electrode of the second thin film transistor is electrically connected to a second pixel sub-electrode.

12. The display panel of claim 3, further comprising a plurality of gate lines and a plurality of data lines crossing over each other, defining a plurality of sub-pixels;
wherein two adjacent gate lines are between two adjacent rows of sub-pixels;
each sub-pixel comprises a first thin film transistor and a second thin film transistor, and are adjacent to a first adjacent gate line on a first side of the each sub-pixel and a second adjacent gate line on a second side of the each sub-pixel;
a gate electrode of the first thin film transistor is electrically connected to the first adjacent gate line;
a gate electrode of the second thin film transistor is electrically connected to the second adjacent gate line;
a source electrode of the first thin film transistor is electrically connected to a first data line;
a source electrode of the second thin film transistor is electrically connected to a second data line; and
drain electrodes of the first thin film transistor and the second thin film transistor are electrically connected to two sub-electrodes of a same pixel electrode; and
a drain electrode of the second thin film transistor is electrically connected to a second pixel sub-electrode.

13. The display panel of claim 5, further comprising a plurality of single gate lines and a plurality of data lines crossing over each other, defining a plurality of sub-pixels within each pixel unit;
each sub-pixel comprises a single thin film transistor, the gate electrode of the single thin film transistor is electrically connected to a single gate line corresponding to the sub-pixel, the source electrode of the single thin film transistor is electrically connected to the date line corresponding to the sub-pixel, and the drain electrode of the thin film transistor is electrically connected to a pixel electrode; and
each data line has a shape compatible with the shape of a corresponding pixel electrode.

14. A color filter substrate, comprising an array of pixel units, each pixel unit comprising a red sub-pixel area, a green sub-pixel area, and a blue sub-pixel area;
wherein the red sub-pixel area comprises a red color filter and a first white color filter, the green sub-pixel area comprises a green color filter and a second white color filter, the blue sub-pixel area comprises a blue color filter and a third white color filter; and
the red color filter has an area $A_R$, the first white color filter has an area $B_R$, the green sub-pixel area has an area $A_G$, the second white color filter has an area $B_G$, the blue sub-pixel area has an area $A_B$, the third white color filter has an area $B_B$;
$A_R:A_G:A_B$ is substantially the same as $\alpha_R:\alpha_G:\alpha_B$;
$B_R:B_G:B_B$ is substantially the same as $\beta_R:\beta_G:\beta_B$;
$(\alpha_R+\beta_R)$, $(\alpha_G+\beta_G)$, and $(\alpha_B+\beta_B)$ are substantially equal to 1; and
one or more of $\alpha_R$, $\alpha_G$ and $\alpha_B$ is a known parameter.

15. The color filter substrate of claim 14, wherein the first white color filter, the second white color filter, and the third white color filter constitute a single integral white color filter.

16. An array substrate, comprising an array of pixel units, each pixel unit comprising a red sub-pixel area, a green sub-pixel area, and a blue sub-pixel area;
the red sub-pixel area comprising a first pixel electrode; the green sub-pixel area comprises a second pixel electrode; and the blue sub-pixel area comprises a third pixel electrode;
wherein the red sub-pixel area comprises a red light emitting region configured to emit red light and a first white light emitting region configured to emit white light, the green sub-pixel area comprises a green light emitting region configured to emit green light and a second white light emitting region configured to emit white light, the blue sub-pixel area comprises a blue light emitting region configured to emit blue light and a third white light emitting region configured to emit white light;
a projection on the array substrate of the first pixel electrode substantially overlaps with that of the red light emitting region resulting in an overlapping area $A_R$ and with that of the first white light emitting region resulting in an overlapping area $B_R$;
a projection on the array substrate of the second pixel electrode substantially overlaps with that of the green light emitting region resulting in an overlapping area $A_G$ and with that of the second white light emitting region resulting in an overlapping area $B_G$; and a projection on the array substrate of the third pixel electrode substantially overlaps with that of the blue light emitting region resulting in an overlapping area $A_B$ and with that of the third white light emitting region resulting in an overlapping area $B_B$; and $A_R:A_G:A_B$ is substantially the same as $\alpha_R: \alpha_G: \alpha_B$;

$B_R:B_G:B_B$ is substantially the same as $\beta_R:\beta_G:\beta_B$;

$(\alpha_R+\beta_R)$, $(\alpha_G+\beta_G)$, and $(\alpha_B+\beta_B)$ are substantially equal to 1; and one or more of $\alpha_R$, $\alpha_G$ and $\alpha_B$ is a known parameter.

17. The array substrate of claim 16, wherein the red sub-pixel area comprises a red light emitting layer in the red light emitting region and a first white light emitting layer in the first white light emitting region, the green sub-pixel area comprises a green light emitting layer in the green light emitting region and a second white light emitting layer in the second white light emitting region, the blue sub-pixel area comprises a blue light emitting layer in the blue light emitting region and a third white light emitting layer in the third white light emitting region.

18. The array substrate of claim 16, further comprising:

a projection on the array substrate of the first pixel electrode substantially overlaps with that of the red light emitting layer resulting in the overlapping area $A_R$ and with that of the first white light emitting layer resulting in the overlapping area $B_R$;

a projection on the array substrate of the second pixel electrode substantially overlaps with that of the green light emitting layer resulting in the overlapping area $A_G$ and with that of the second white light emitting layer resulting in the overlapping area $B_G$; and a projection on the array substrate of the third pixel electrode substantially overlaps with that of the blue light emitting layer resulting in the overlapping area $A_B$ and with that of the third white light emitting layer resulting in the overlapping area $B_B$.

19. The array substrate of claim 16, wherein the first pixel electrode comprises a first pixel sub-electrode and a second pixel sub-electrode spaced apart from each other, the second pixel electrode comprises a third pixel sub-electrode and a fourth sub-electrode spaced apart from each other, the third pixel electrode comprises a fifth pixel sub-electrode and a sixth pixel sub-electrode spaced apart from each other;

a projection on the array substrate of the first pixel sub-electrode substantially overlaps with that of the red light emitting region resulting in the overlapping area $A_R$;

a projection on the array substrate of the second pixel sub-electrode substantially overlaps with that of the first white light emitting region resulting in the overlapping area $B_R$;

a projection on the array substrate of the third pixel sub-electrode substantially overlaps with that of the green light emitting region resulting in the overlapping area $A_G$;

a projection on the array substrate of the fourth pixel sub-electrode substantially overlaps with that of the second white light emitting region resulting in the overlapping area $B_G$; and a projection on the array substrate of the fifth pixel sub-electrode substantially overlaps with that of the blue light emitting region resulting in an overlapping area $A_B$; and a projection on the array substrate of the sixth pixel sub-electrode substantially overlaps with that of the third white light emitting region resulting in the overlapping area $B_B$.

20. The array substrate of claim 16, wherein the first pixel electrode is an integral pixel electrode, the second pixel electrode is an integral pixel electrode, and the third pixel electrode is an integral pixel electrode.

* * * * *